(12) United States Patent
Tomioka et al.

(10) Patent No.: US 7,280,357 B2
(45) Date of Patent: Oct. 9, 2007

(54) PUMP AND ELECTRONIC DEVICE HAVING THE PUMP

(75) Inventors: Kentaro Tomioka, Sayama (JP); Yukihiko Hata, Hamura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 293 days.

(21) Appl. No.: 11/084,654

(22) Filed: Mar. 18, 2005

(65) Prior Publication Data

US 2005/0243520 A1 Nov. 3, 2005

(30) Foreign Application Priority Data

Apr. 28, 2004 (JP) ............................. 2004-133533

(51) Int. Cl.
*H05K 7/20* (2006.01)
(52) U.S. Cl. ...................... 361/699; 361/719; 257/714; 165/80.4; 174/15.1; 415/177
(58) Field of Classification Search ..................... None
See application file for complete search history.

(56) References Cited

U.S. PATENT DOCUMENTS

| | | |
|---|---|---|
| 4,712,159 A | 12/1987 | Clemens |
| 5,089,936 A | 2/1992 | Kojima et al. |
| 5,168,926 A | 12/1992 | Watson |
| 5,268,817 A | 12/1993 | Miyagawa et al. |
| 5,594,619 A | 1/1997 | Niyagawa et al. |
| 5,648,889 A | 7/1997 | Bosli |
| 5,731,952 A | 3/1998 | Ohgami et al. |
| 5,770,478 A | 6/1998 | Iruvanti et al. |
| 5,901,035 A | 5/1999 | Foster et al. |
| 5,903,436 A * | 5/1999 | Brownell et al. ........... 361/704 |
| 6,005,767 A | 12/1999 | Ku et al. |
| 6,026,888 A | 2/2000 | Moore |
| 6,049,459 A | 4/2000 | Edmonds et al. |
| 6,141,214 A | 10/2000 | Ahn |
| 6,148,906 A | 11/2000 | Li et al. |
| 6,166,907 A | 12/2000 | Chien |
| 6,196,850 B1 | 3/2001 | Dietz et al. |
| 6,231,371 B1 | 5/2001 | Helot |
| 6,282,082 B1 | 8/2001 | Armitage et al. |
| 6,288,896 B1 | 9/2001 | Hsu |
| 6,296,048 B1 | 10/2001 | Sauer |
| 6,313,990 B1 | 11/2001 | Cheon |
| 6,327,145 B1 | 12/2001 | Lian et al. |
| 6,333,847 B1 | 12/2001 | Katsui et al. |
| 6,377,452 B1 | 4/2002 | Sasaki et al. |

(Continued)

FOREIGN PATENT DOCUMENTS

CN  1479185  3/2004

(Continued)

*Primary Examiner*—Boris Chervinsky
(74) *Attorney, Agent, or Firm*—Blakely Sokoloff Taylor & Zafman, LLC

(57) ABSTRACT

In one embodiment of the invention, a pump includes a pump housing, an impeller, and a motor. The pump housing has a pump chamber and a heat receiving plate to couple to a heat generating unit, such as a CPU. The impeller is provided in the pump chamber. The motor couples to the impeller to rotate it. A region of the heat receiving plate projects further outward than other regions to couple the heat receiving plate to the IC chip.

20 Claims, 8 Drawing Sheets

U.S. PATENT DOCUMENTS

| | | |
|---|---|---|
| 6,396,687 B1 | 5/2002 | Sun et al. |
| 6,408,937 B1 | 6/2002 | Roy |
| 6,418,017 B1 | 7/2002 | Patel et al. |
| 6,430,038 B1 | 8/2002 | Helot et al. |
| 6,437,973 B1 | 8/2002 | Helot et al. |
| 6,464,195 B1 | 10/2002 | Hildebrandt |
| 6,473,296 B2 | 10/2002 | Amemiya et al. |
| 6,477,871 B1 | 11/2002 | Shaw et al. |
| 6,483,445 B1 | 11/2002 | England |
| 6,519,143 B1 | 2/2003 | Goko |
| 6,519,147 B2 | 2/2003 | Nakagawa et al. |
| 6,519,148 B2 | 2/2003 | Nakagawa et al. |
| 6,532,152 B1 | 3/2003 | White et al. |
| 6,570,764 B2 | 5/2003 | Bhatia et al. |
| 6,594,149 B2 | 7/2003 | Yamada et al. |
| 6,625,022 B2 | 9/2003 | Frutschy et al. |
| 6,625,024 B2 | 9/2003 | Mermet-Guyennet |
| 6,652,223 B1 | 11/2003 | Horng et al. |
| 6,654,234 B2 | 11/2003 | Landry et al. |
| 6,656,770 B2 | 12/2003 | Atwood et al. |
| 6,668,911 B2 * | 12/2003 | Bingler .................. 165/80.4 |
| 6,702,007 B1 | 3/2004 | Pan et al. |
| 6,717,798 B2 | 4/2004 | Bell et al. |
| 6,728,102 B2 | 4/2004 | Ishikawa et al. |
| 6,741,465 B2 | 5/2004 | Holalkere et al. |
| 6,741,470 B2 | 5/2004 | Isenburg |
| 6,752,204 B2 | 6/2004 | Dishongh et al. |
| 6,755,626 B2 | 6/2004 | Komatsu et al. |
| 6,757,170 B2 | 6/2004 | Lee et al. |
| 6,768,637 B1 | 7/2004 | Amemiya |
| 6,774,870 B2 | 8/2004 | Mead, Jr. et al. |
| 6,779,894 B2 | 8/2004 | Shiraishi et al. |
| 6,785,128 B1 | 8/2004 | Yun |
| 6,804,115 B2 | 10/2004 | Lai |
| 6,808,371 B2 * | 10/2004 | Niwatsukino et al. ...... 417/353 |
| 6,809,927 B2 | 10/2004 | Ohashi et al. |
| 6,809,930 B2 | 10/2004 | Mueller et al. |
| 6,829,139 B1 | 12/2004 | Duarte |
| 6,831,836 B2 | 12/2004 | Bhatia et al. |
| 6,839,234 B2 | 1/2005 | Niwatsukino et al. |
| 6,845,011 B2 | 1/2005 | Tomioka et al. |
| 6,856,506 B2 | 2/2005 | Doherty et al. |
| 6,870,736 B2 | 3/2005 | Lee et al. |
| 6,873,521 B2 | 3/2005 | Landry et al. |
| 6,894,899 B2 * | 5/2005 | Wu et al. .................... 361/699 |
| 6,924,978 B2 | 8/2005 | DiStefano |
| 6,927,978 B2 | 8/2005 | Arai et al. |
| 6,983,789 B2 * | 1/2006 | Jenkins et al. ............. 165/80.3 |
| 7,016,195 B2 * | 3/2006 | Ito et al. ..................... 361/699 |
| 7,054,158 B2 | 5/2006 | Kimmich |
| 7,055,581 B1 | 6/2006 | Roy |
| 7,077,189 B1 * | 7/2006 | Reyzin et al. ............. 165/80.4 |
| 7,079,394 B2 | 7/2006 | Mok |
| 7,095,614 B2 | 8/2006 | Goldman |
| 7,124,811 B2 | 10/2006 | Crocker et al. |
| 7,143,815 B2 * | 12/2006 | Lee et al. .................. 165/80.4 |
| 2002/0018337 A1 | 2/2002 | Nakamura |
| 2002/0053421 A1 | 5/2002 | Hisano et al. |
| 2002/0141159 A1 | 10/2002 | Bloemen |
| 2003/0039097 A1 | 2/2003 | Igarashi |
| 2003/0142474 A1 | 7/2003 | Karidis et al. |
| 2003/0214786 A1 | 11/2003 | Niwatsukino et al. |
| 2004/0001310 A1 | 1/2004 | Chu et al. |
| 2004/0027800 A1 | 2/2004 | Tanimoto et al. |
| 2004/0042176 A1 | 3/2004 | Niwatsukino et al. |
| 2004/0057197 A1 | 3/2004 | Hill et al. |
| 2004/0070942 A1 | 4/2004 | Tomioka et al. |
| 2004/0125566 A1 | 7/2004 | Lee et al. |
| 2005/0007739 A1 | 1/2005 | Gata |
| 2005/0052833 A1 | 3/2005 | Tanaka et al. |
| 2005/0068732 A1 | 3/2005 | Tsuji |
| 2005/0111190 A1 | 5/2005 | Wang et al. |
| 2005/0117298 A1 | 6/2005 | Koga et al. |

FOREIGN PATENT DOCUMENTS

| | | |
|---|---|---|
| CN | 1490696 | 4/2004 |
| EP | 0834795 | 4/1998 |
| JP | 07-049725 | 2/1995 |
| JP | 07-142886 | 6/1995 |
| JP | 08/046097 | 2/1996 |
| JP | 10-004161 | 1/1998 |
| JP | 10-055227 | 2/1998 |
| JP | 10-261884 | 9/1998 |
| JP | 10/303582 | 11/1998 |
| JP | 11-039058 | 2/1999 |
| JP | 11-166500 | 6/1999 |
| JP | 2000-049478 | 2/2000 |
| JP | 2001-057490 | 2/2001 |
| JP | 2001-230356 | 8/2001 |
| JP | 2001-251079 | 9/2001 |
| JP | 2002-099356 | 4/2002 |
| JP | 2002151638 | 5/2002 |
| JP | 2002-344186 | 11/2002 |
| JP | 2003-044169 | 2/2003 |
| JP | 2003-068317 | 3/2003 |
| JP | 2003-101272 | 4/2003 |
| JP | 2003-172286 | 6/2003 |
| JP | 2003-216278 | 7/2003 |
| JP | 3431024 | 7/2003 |
| JP | 2003-233441 | 8/2003 |
| JP | 3452059 | 9/2003 |
| JP | 2003-343492 | 12/2003 |
| JP | 2004-047921 | 2/2004 |

* cited by examiner

PUMP AND ELECTRONIC DEVICE HAVING THE PUMP

CROSS-REFERENCE TO RELATED APPLICATIONS

This application claims the benefit of priority of Japanese Patent Application No. 2004-133533, filed Apr. 28, 2004, the entire contents of which are incorporated herein by reference.

BACKGROUND

1. Field

Embodiments of the invention relate to a pump to be thermally coupled to a heat generating unit, such as a central processing unit (CPU), and to an electronic device having the pump.

2. Description of the Related Art

With enhancement in processing speed and multi-functionality, CPUs have a tendency to increase the amount of heat generation during operation. When the operating temperature of a CPU has excessively increased, the CPU may exhibit problems such as inefficient operation or operational failure.

Under these circumstances, as a CPU-cooling measure, coolers of the type that cools the CPU by using a liquid coolant are known. A cooler of this type has a heat-exchange pump that is situated in close contact with the CPU. The heat-exchange pump has a heat receiving surface that is situated in contact with the CPU to transfer heat away from the CPU. For example, one such heat-exchange pump is disclosed in Japan Pat. No. 3452059.

In the field of electronic devices, there are demanding needs for cooling a heat generating unit, such as a CPU, with higher efficiency. In conventional heat-exchange pumps, however, when a deviation occurs in the shape of the heat receiving surface, it is possible that the heat receiving surface is not thermally coupled to the CPU. More specifically, it is possible that conducting heat away from the CPU to the heat-exchange pump is decreased to such an extent that the CPU is not cooled.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION

Embodiments of the invention are described below with reference to FIGS. 1 to 9.

According to one embodiment of the invention, a pump is provided that includes a pump housing, an impeller, and a motor. The pump is capable of efficiently cooling a heat generating unit. The housing has a pump chamber and a heat receiving portion to thermally couple to a heat generating unit, such as a CPU. The impeller is provided in the pump chamber. The motor is coupled to and rotates the impeller to pump a liquid coolant. A region of the heat receiving portion projects further outward than other regions to couple to the heat generating unit. The region may be circularly projected outwards into a convex shape to couple to the heat generating unit. The heat receiving portion of the pump housing may comprise a heat receiving plate. In one embodiment of the invention, the heat receiving plate may have a variable thickness that increases in the region to project further outward to couple to the heat generating unit. In another embodiment of the invention, the heat receiving plate has a constant thickness and is convexly shaped to project further outward to couple to the heat generating unit.

Figure 1:
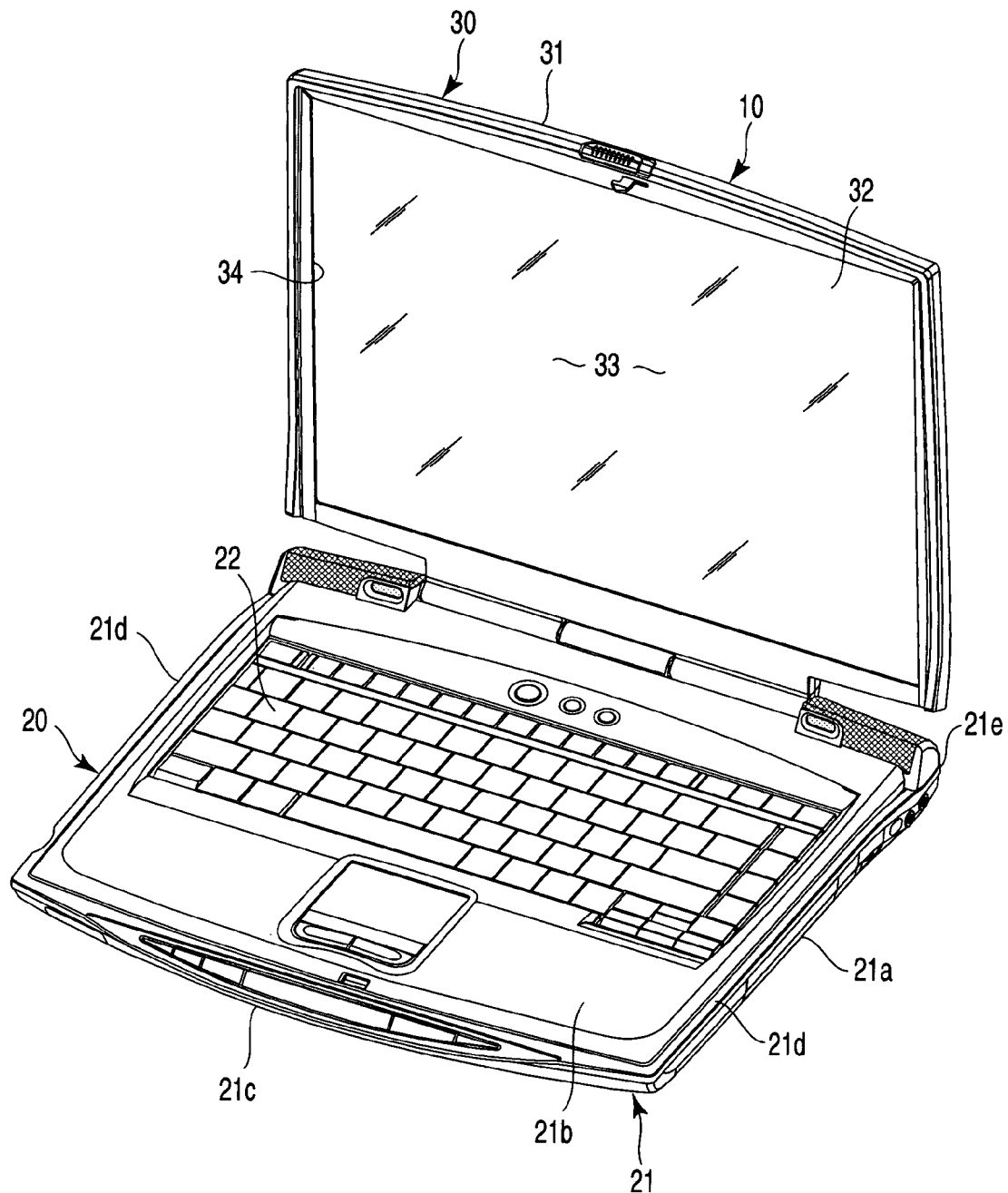
FIG. 1 is a perspective view showing a portable computer according to a first embodiment of the invention.

FIG. 1 shows an electronic device such as a portable computer 10. The portable computer 10 has a computer main body 20 and a display unit 30. The computer main body 20 has a flat box-like first housing 21.

Figure 2:
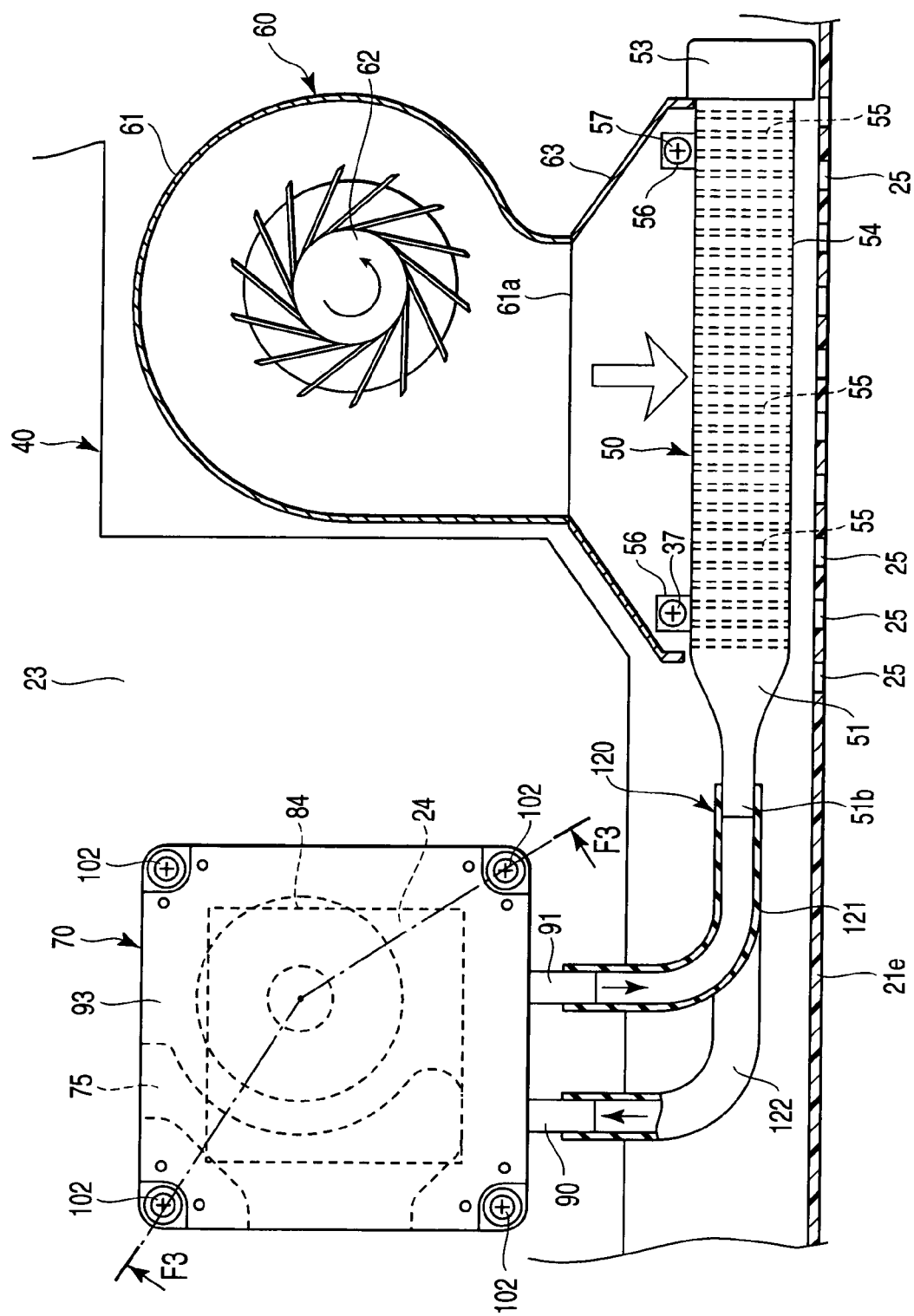
FIG. 2 is a plan view of a cooler accommodated in a first housing.

The first housing 21 has a bottom wall 21a, an upper wall 21b, a front wall 21c, left and right sidewalls 21d, and a rear wall 21e. The upper wall 21b of the first housing 21 supports a keyboard 22. The front wall 21c, the left and right sidewalls 21d, and the rear wall 21e form a peripheral wall of the first housing 21. With reference to FIG. 2, a plurality of exhaust openings 25 are formed in the rear wall 21e.

The display unit 30 has a second housing 31 and a LCD (liquid crystal display) panel 32. The LCD panel 32 is accommodated in the second housing 31. The LCD panel 32 has a screen 33 that displays images. The screen 33 is exposed outwardly of the second housing 31 through an opening portion 34 formed on a front plane of the second housing 31.

The second housing 31 is supported through a hinge (not shown) to a rear end portion of the first housing 21. As such, the display unit 30 is pivotally movable between a closed position and an open position. The closed position is a position with the display unit 30 lying on the computer main body 20 so as to cover the keyboard 22. The open position is a position where the display unit 30 stands up with respect to the computer main body 20 causing the keyboard 22, the screen 33, and the like to be exposed.

Figure 3:
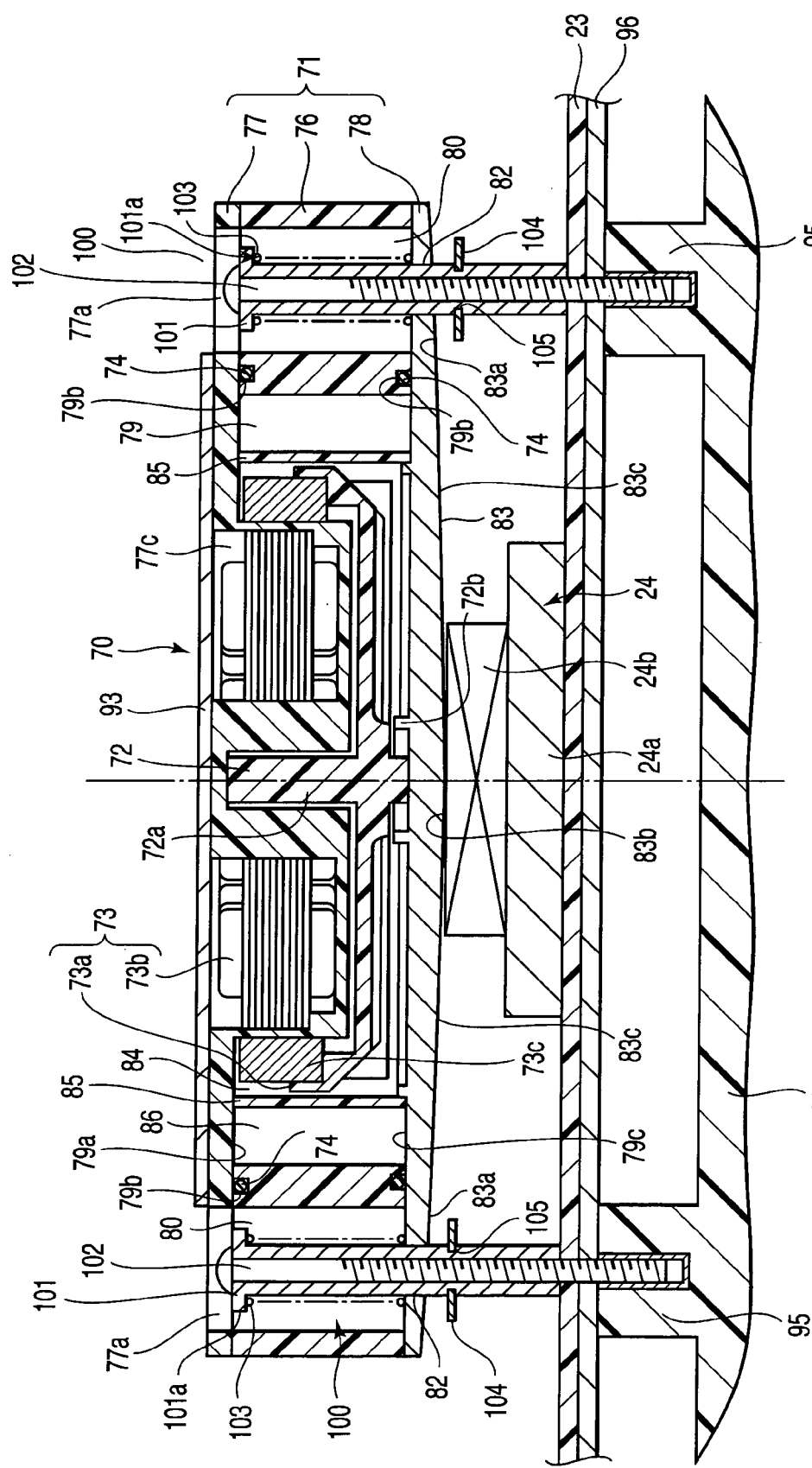
FIG. 3 is a vertical sectional view of a part of the portable computer taken along the line F3—F3 of FIG. 2.

Referring now to FIGS. 2 and 3, a printed circuit board 23 is accommodated in the first housing 21. A central processing unit (CPU) 24, a heat generating unit, is mounted on an upper face of the printed circuit board 23. The CPU 24 has a base substrate 24a and an integrated circuit (IC) chip 24b. The IC chip 24b is positioned in a central portion of the upper face of the base substrate 24a. With enhancement in properties of the CPU 24, such as processing speed and multi-functionality, the IC chip 24b generates a very large amount of heat during operation, requiring that it be cooled in order to maintain a stable operation.

As is shown in FIG. 2, the computer main body 20 accommodates a liquid-cooling type cooler or cooling system 40 which cools the CPU 24 by using a liquid coolant, such as antifreeze. The cooler 40 may include a heat dissipation portion 50, an electric fan 60, a pump 70, and a circulation path 120.

Figure 4:
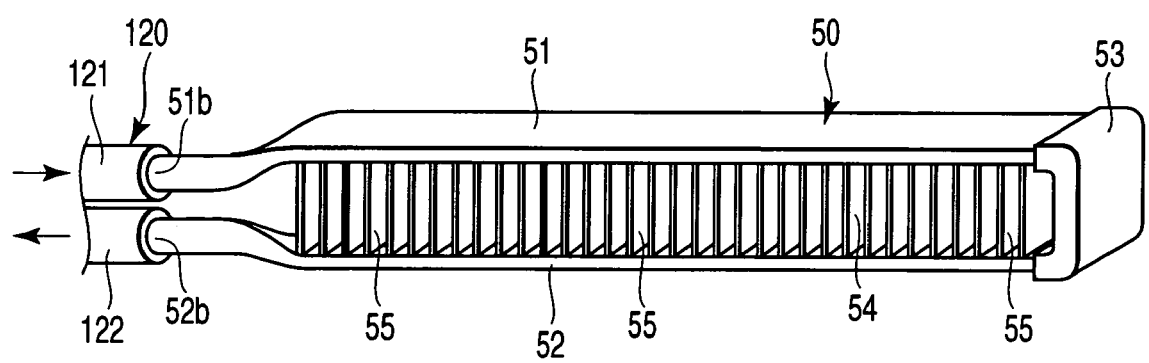
FIG. 4 is a perspective view of a heat dissipation portion.

As shown in FIGS. 2 and 4, the heat dissipation portion 50 has first to third path component members 51 to 53 through which the liquid coolant flows. The first and second path component members 51 and 52 are formed to extend along a width direction of the first housing 21.

As illustrated in FIG. 4, the first and second path component members 51 and 52 oppose each other in parallel with a width-wise spacing therebetween along a thickness direction of the first housing 21. An upstream end of the first path component member 51 is formed as a coolant inlet opening 51b through which the liquid-coolant may flow in. A downstream end of the second path component member 52 is formed as a coolant outlet opening 52b through which the liquid coolant may flow out. As shown in FIG. 4, the third path component member 53 connects between a downstream end of the first path component member 51 and an upstream end of the second path component member 52.

A plurality of dissipation fins 55 is disposed between the first path component member 51 and the second path component member 52. The dissipation fins 55 are soldered to the first path component member 51 and the second path component member 52. In the heat dissipation portion 50 thus configured, the dissipation fins 55 oppose the exhaust openings 25 formed in the rear wall 21e of the first housing 21. The second path component member 52 may be positioned on the bottom wall 21a of the first housing 21. Brackets 56 in a pair are individually soldered to edge portions of the second path component member 52. The brackets 56 are each secured with a screw 57 to a boss portion projecting from the bottom wall 21a.

As illustrated in FIG. 2, the electric fan 60 blows cooling air to the heat dissipation portion 50, and is positioned immediately anterior to the heat dissipation portion 50. The electric fan 60 has a fan casing 61 and a centrifugal impeller 62 accommodated in the fan casing 61. The fan casing 61 has an outlet opening 61a to allow cooling air to flow towards the heat dissipation portion 50. The outlet opening 61a is coupled to the heat dissipation portion 50 through a duct 63.

The impeller 62 is driven by a motor (not shown). The impeller 62 may be periodically driven, such as at power-on of the portable computer 10 and when the temperature of the CPU 24 has reached a predetermined level, for example. Thereby, the impeller 62 is rotated, and cooling air is supplied from the outlet opening 61a of the fan casing 61 to the heat dissipation portion 50.

Figure 5:
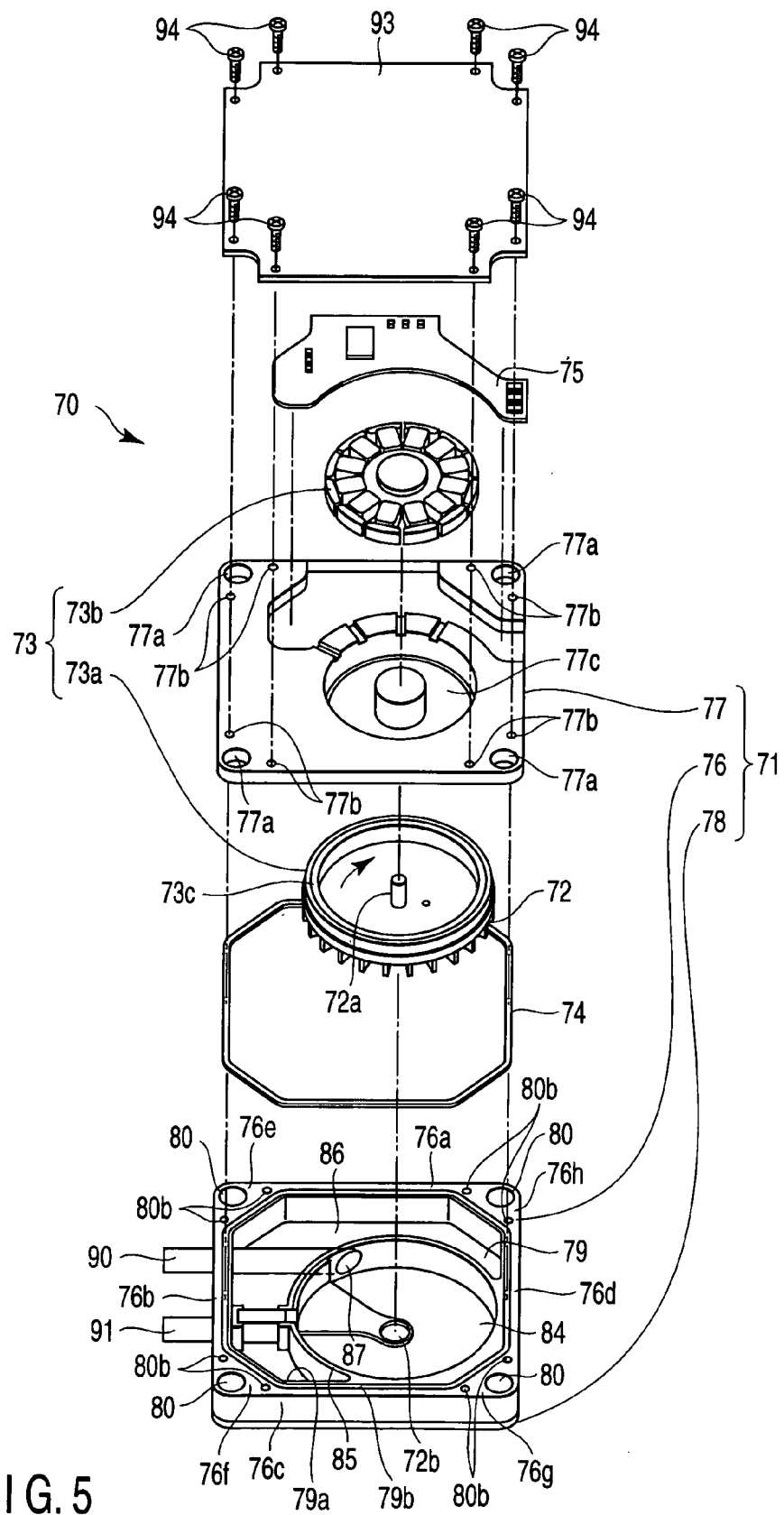
FIG. 5 is an exploded perspective view of a pump.

As shown in the exploded view of FIG. 5, the pump 70 may include a pump housing 71, an impeller 72, a motor 73, and a control board 75.

Figure 6:
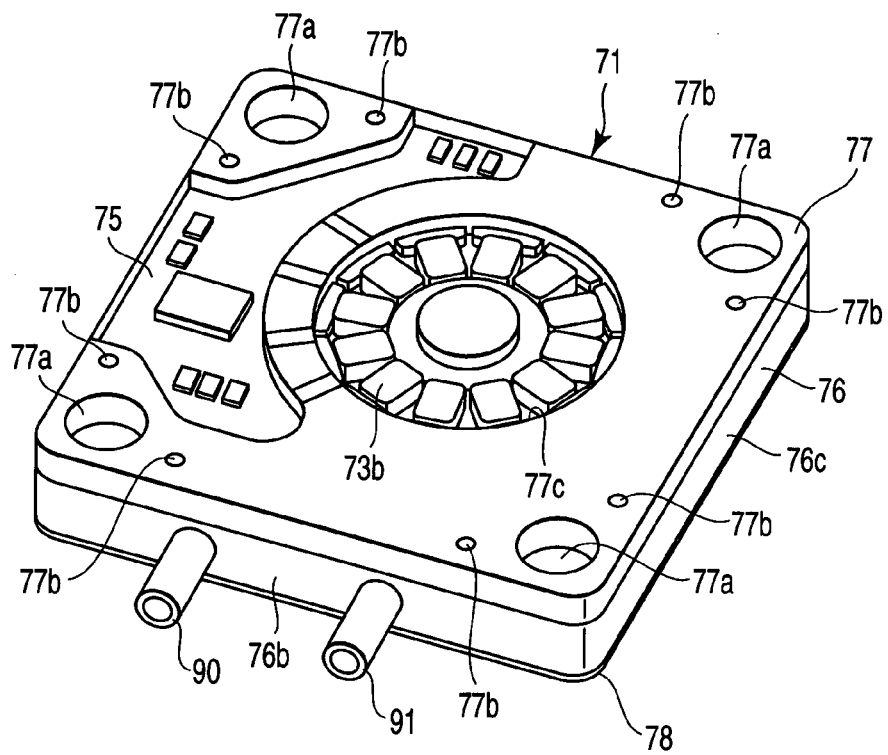
FIG. 6 is a perspective view of a pump housing.

As shown in FIG. 6, the pump housing 71 may include a housing body 76, a top cover 77, and a heat receiving plate 78 as a heat receiving portion. The housing body 76 may be shaped as a flat rectangular parallelepiped, and formed out of a synthetic resin. As shown in FIG. 3, the housing body 76 has an accommodation portion 79 extending from an upper end face to a lower end face.

Figure 7:
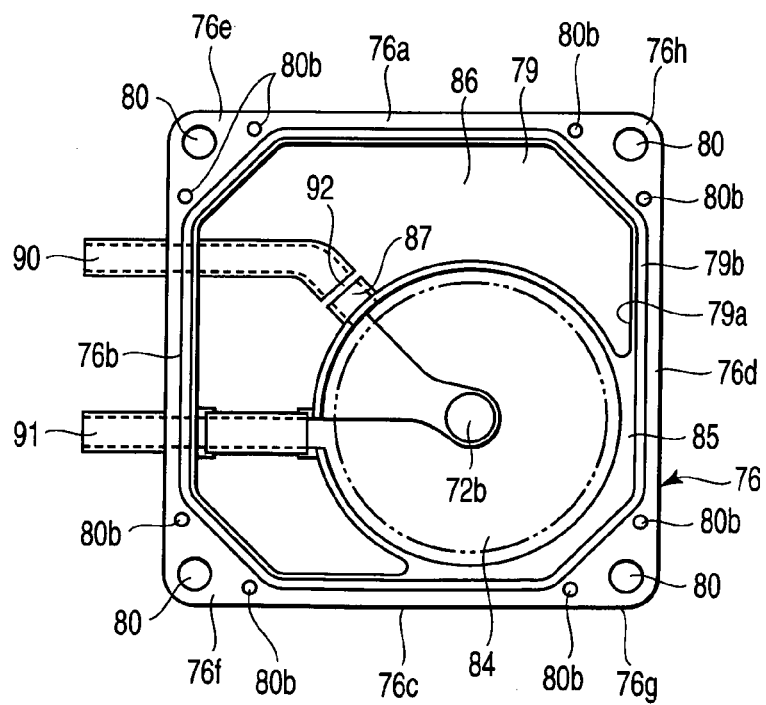
FIG. 7 is a plan view of a housing body of the pump housing.

As shown in FIG. 7, the accommodation portion 79 may be defined by inner faces of four sidewalls 76a–76d of the housing body 76 and inner faces of four corner portions 76e–76h, each corner portion having a substantially right-angled triangular shape. Thereby, the accommodation portion 79 may be formed into a substantially plano-octagonal shape.

A groove portion 79b may be formed along the outer periphery of an upper opening 79a of the accommodation portion 79 on an upper end face of the housing body 76, and, more specifically, on upper end faces of the four sidewalls 76a–76d and the four corner portions 76e–76h. An O-ring 74 may be provided in the groove portion 79b.

As shown in FIGS. 3 and 7, a first through-hole 80 is formed in each of the four corner portions 76e–76h. The first through-holes 80 vertically pass through the housing body 76. As shown in FIG. 7, a pair of screw receiving portions 80b may be provided on the upper end face of the housing body 76 located on opposite sides of each of the first through-holes 80 so its centered therebetween.

The heat receiving plate 78 is mounted on the lower end face of the housing body 76 in such a manner as to cover the entirety of the lower end face of the housing body 76. The heat receiving plate 78 concurrently functions as a bottom wall of the accommodation portion 79, thereby to provide a liquid tight seal for a lower opening 79c of the accommodation portion 79. A groove portion 79b may be formed along the periphery of the accommodation portion 79 on the lower end face of the housing body 76. An O-ring 74 may be accommodated in the groove portion 79b. In one embodiment of the invention, the heat receiving plate 78 is formed of a high thermal conductivity metal material, such as copper. It is understood that copper is one exemplary material that may be used to form the heat receiving plate 78.

In the heat receiving plate 78, second through-holes 82 may be formed in positions corresponding to the first through-holes 80 to provide one exemplary mounting portion. The second through-hole 82 may be formed smaller than the first through-hole 80.

The heat receiving plate 78 has a face on the opposite side of the housing body 76 that serves as a heat receiving surface 83 to receive heat from the CPU 24. As shown in FIGS. 3 and 7, the heat receiving plate 78 is provided with a partition wall member 85 that partitions plano-circular pump chamber 84 from the accommodation portion 79 in an inner face of the accommodation portion 79.

The partition wall member 85 may be situated close to the side of one of the four corner portions 76e to 76h, such as the corner portion 76g, of the accommodation portion 79. For this reason, the pump chamber 84 may be situated close to the corner portion 76g side of the accommodation portion 79.

An interior portion of the accommodation portion 79 is separated by the partition wall member 85 into the pump chamber 84 and a reservoir tank 86. The reservoir tank 86 may be formed in such a manner so as to surround the pump chamber 84 from the sides of the three corner portions 76e, 76f, and 76h.

As illustrated in FIG. 7, the partition wall member 85 is provided with a communication opening 87 that communicates between the interior portion of the reservoir tank 86 and the interior portion of the pump chamber 84. A suction pipe 90 and a discharge pipe 91 are provided in the housing body 76. The suction pipe 90 and the discharge pipe 91 are horizontally disposed spaced apart from each other. An upstream end of the suction pipe 90 may outwardly protrude from a sidewall 76b of the housing body 76. A downstream end of the suction pipe 90 is opened to the inside of the reservoir tank 86, and may oppose the communication opening 87.

As illustrated in FIG. 7, a spacing 92 is formed between the downstream end of the suction pipe 90 and the communication opening 87. The spacing 92 has a gas-liquid separation function that separates bubbles occurring in the coolant. The spacing 92 is located within the pump such that it is maintained under the liquid level of liquid coolant being stored in the reservoir tank 86, even though the pump 70 changes its orientation or directional position.

The downstream end of the discharge pipe 92 outwardly protrudes from the sidewall 76b of the housing body 76, and may be located in juxtaposition with the upstream end of the suction pipe 90. An upstream end of the discharge pipe 91 may extend through the partition wall member 85, and opens into the inside of the pump chamber 84.

Referring now to FIGS. 5–6, the top cover 77 of the pump housing is provided above the housing body 76 in such a manner as to cover the upper opening 79a of the accommodation portion 79 of the housing body 76. The top cover 77 may be formed of a synthetic resin in one embodiment of the invention. Opening portions 77a are formed at positions corresponding to the first through-holes 80 in corner portions of the top cover 77. When the top cover 77 is overlaid on the housing body 76, an inner circumferential surface of each of the opening portions 77a is continued to an inner circumferential surface of the first through-holes 80. A pair of screw pass-through openings 77b is provided in the top cover 77 located on opposite sides of each opening portion 77a so it is sandwiched therebetween. The screw pass-through openings 77b in the top cover 77 align with and continue to the screw receiving portions 80b in the housing body 76.

The O-ring 74 may be provided to the periphery of the upper opening 79a of the accommodation portion 79. As such, the top cover 77 provided on the upper end face of the housing body 76 seals the upper opening 79a of the accommodation portion 79 to be liquid-tight.

The impeller 72 is discoidal and has a rotation axis 72a in a rotation center portion. In one embodiment of the invention, the rotation axis 72a extends between the heat receiving plate 78 and the top cover 77. Thereby, the rotation axis 72a is rotatably supported by the heat receiving plate 78 and the top cover 77. A support portion 72b which supports the axis 72a may be provided by the heat receiving plate 78.

Referring now back to FIG. 3, the motor 73 has a rotor 73a and a stator 73b. The rotor 73a is formed in the form of a ring. The rotor 73a is accommodated in the pump chamber 84 to rotate while being coaxially secured to an upper face of the impeller 72. A magnet 73c magnetized through multiple positive polarities and negative polarities is fitted to an inner side of the rotor 73a. The motor 73 and impeller 72 are integrally rotated.

The stator 73b is accommodated in a recess portion 77c formed on the upper face of the top cover 77. The recess portion 77c extends to an inner side of the rotor 73a. As such, the stator 73b is coaxially accommodated in the inner side of the rotor 73a.

Referring now to FIGS. 3 and 5–6, the control board 75 is supported by the upper face of the top cover 77. The control board 75 is electrically coupled to the stator 73b, thereby controlling the motor 73. Energization of the stator 73b is performed periodically, such as at the same time of a power-on operation of the portable computer 10, for example. By the energization, a rotation magnetic field occurs in the circumferential direction of the stator 73b to which the magnet 73c mounted in the rotor 73a is magnetically coupled. Consequently, torque along the circumferential direction of the rotor 73a is generated between the stator 73b and the magnet 73c. Thereby, the impeller 72 is rotated clockwise, as shown by an arrow mark in FIG. 5.

Referring now to FIG. 5, a back plate 93 may be provided on the upper face of the top cover 77 to cover the stator 73b and the control board 75. The back plate 93 may prevent liquid coolant leaking out of the pump housing 71. However, if no exudation of liquid coolant occurs through the top cover 77, the back plate 93 need not be provided.

The back plate 93 can be secured to the pump housing 71 concurrently with the top cover 77. The top cover 77 is secured to the housing body 76 by insertion of screws 94 into the screw pass-through openings 77b of the top cover 77 and the screw receiving portions 80b of the housing body 76.

The pump 70 thus configured is placed over the printed circuit board 23 in a manner such that the heat receiving surface 83 covers the CPU 24. As shown in FIGS. 2 and 3, in one embodiment of the invention, the pump housing 71 is overlaid on the CPU 24 so that the CPU 24 is positioned substantially in a center portion of the heat receiving surface 83.

Referring now back to FIG. 3, the heat receiving surface 83 includes a first region 83a, a second region 83b, and a third region 83c. The first region 83a corresponds to the first through-holes 80; the second region 83b corresponds to the IC chip 24b; and the third region 83c is positioned between the first and the second regions 83a and 83b.

The heat receiving plate 78 is so formed to be gradually thicker toward a central portion from the outer periphery such that the second region 83b is formed to be convex shaped in the direction of the IC chip 24b. Therefore, the heat receiving plate 78 smoothly and circularly projects outward away from the pump housing 71. Thus, in comparison with the first and third regions 83a and 83c, the second region 83b of the heat receiving surface 83 projects further outward to better contact the IC chip 24b.

More specifically, in the heat receiving surface 83, the second region 83b corresponding to the IC chip 24b projects closer to the CPU 24 than the other regions, i.e., the first and third regions 83a and 83c. For example, the second region 83b may project outward 30 to 50 microns (μm) further than the outer periphery of the heat receiving plate 78.

In one embodiment of the invention, the IC chip 24b is positioned substantially in the center portion of the base substrate 24a, and the CPU 24 is positioned substantially in the center portion of the heat receiving surface 83. As such, although the central portion of the heat receiving surface 83 corresponds to the second region 83b, this imposes no limitation. In another embodiment of the invention, the IC chip 24b and the CPU 24 are offset from the central portion of the heat receiving surface 83 such that the region of the heat receiving surface 83 projecting out to make contact with the IC chip 24b becomes the second region 83b.

As is shown in FIG. 3, the bottom wall 21a of the first housing 21 has boss portions 95 in positions corresponding to the first through-holes 80 located in the four corner portions 76e to 76h of the pump housing 71. The boss portions 95 project upwardly from the bottom wall 21a. The printed circuit board 23 may be overlaid on edge faces of these boss portions 95 through a reinforcing plate 96. Together with the printed circuit board 23, the pump housing 71 is secured by a mounting mechanism 100, an exemplary securing means, to the boss portions 95 of the bottom wall 21a of the first housing 21.

In one embodiment of the invention, the mounting mechanism 100 includes inserts 101, screws 102, coil springs 103, and C-rings 104. The insert 101 is cylindrical such that one end can be inserted into a second through-hole 82. The inserts 101 may each have a projection portion 101a located at another end. The projection portion 101a projects from the outer circumferential surface to a horizontal outer side along the circumferential direction.

The projection portion 101a is sized to be engageable with the periphery of the second through-hole 82 so as to not go thereinto. A groove portion 105 along the circumferential direction is formed on an outer circumferential surface of the insert towards the other end portion. The coil springs 103 are sized to allow insertion of the insert 101 into the inside of the coil springs.

The mounting mechanism 100 secures a pump 70 to the first housing 21 in the following manner. First, the respective insert 101 is inserted into the coil spring 103. Then, the insert 101 is inserted from an edge portion of the groove portion 105 into the opening portion 77*a* of the top cover 77. The insert 101 is inserted until the edge portion on the groove portion 105 side passes through the second through-hole 82. In this case, the coil spring 103 engages the periphery of the second through-hole 82.

After the groove portion 105 is inserted through the second through-hole 82, the C-ring 104 is fitted into the groove portion 105. Thereby, the insert 101 is mounted to the pump 70 in a spring-loaded state such that the coil spring 103 applies a force on the projection portion 101*a*.

Subsequently, a conductive grease (not shown) is applied on an upper face of the IC chip 24*b*, and the pump 70 is mounted so that the second region 83*b* of the heat receiving surface 83 and the IC chip 24*b* oppose each other. Then, the respective screw 102 is inserted into the insert 101. In this case, the screw 102 is passed through the insert 101 and is turned into the boss portion 95. Thereby, the insert 101 is secured to the boss portion 95. The second region 83*b* of the heat receiving surface 83 is urged by resilience against the IC chip 24*b*.

Figure 8:
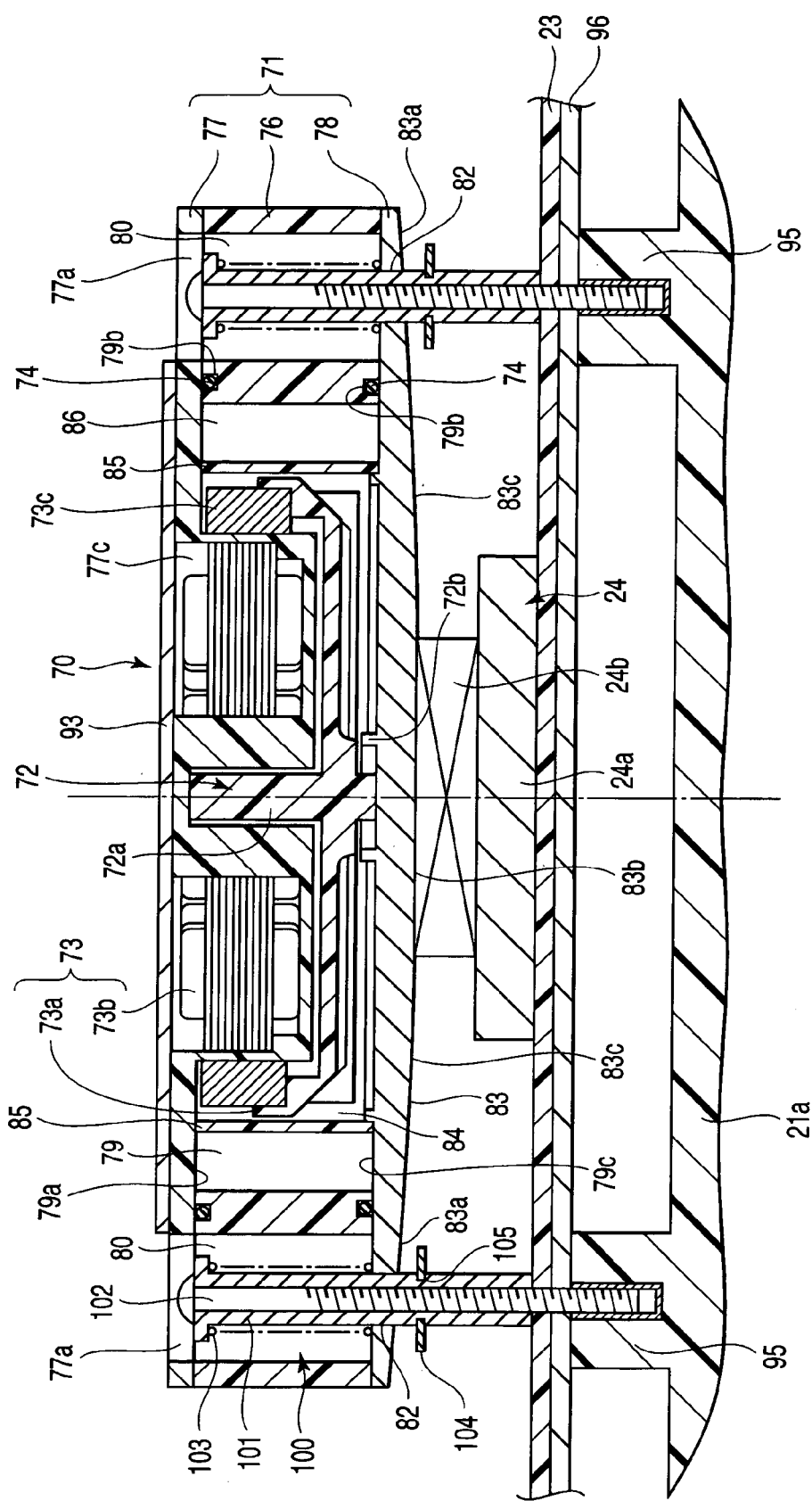
FIG. 8 is a vertical sectional view of a part of the portable computer showing a mounting structure of the pump.

Accordingly, with the projected second region 83*b* of the heat receiving surface 83, the IC chip 24*b* is securely thermally coupled to the second region 83*b* through the conductive grease. In addition, as is shown in FIG. 8, a thermal coupling area between the second region 83*b* and the IC chip 24*b* can be increased by adjusting the force coupling the second region 83*b* to the IC chip 24*b* to cause the heat receiving surface 83 to be deflected.

In embodiments of the invention previously described, the second region 83*b* projects further out to couple to the IC chip 24*b*. However in an alternate embodiment of the invention, the first region 83*a* may project further out and down towards the IC chip 24*b* than the second region 83*b* (i.e., the heat receiving surface 83 is concavely shaped). As described previously, the first region 83*a* corresponds to the second through-holes 82 and is secured onto the printed circuit board 23 through inserts 101. If the distance by which the first region 83*a* projects more than the second region 83*b* is less than the thickness of the CPU 24, the second region 83*b* thermally couples to the IC chip 24*c*.

The position of the groove portion 105 of the insert 101 may be changed corresponding to the thickness of the first region 83*a*. The thickness of the CPU 24 is the distance from the upper face of the IC chip 24*b* to the lower face of the base substrate 24*a*.

As shown in FIGS. 2 and 4, the circulation path 120 has first piping 121, second piping 122, and first to third path component members 51–53 of the heat dissipation portion 50. The first piping 121 connects between the discharge pipe 91 of the pump housing 71 and the coolant inlet opening 51*b* of the heat dissipation portion 50. The second piping 122 connects between the suction pipe 90 of the pump housing 71 and the coolant outlet opening 52*b* of the heat dissipation portion 50. Thereby, the liquid coolant passes through the first and second pipings 121 and 122 to circulate between the pump 70 and the heat dissipation portion 50.

The first to third path component members 51–53 constitute the heat dissipation portion 50, and may also be considered as a part of the circulation path 120.

The pump chamber 84 and reservoir tank 86 of the pump 70 along with the heat dissipation portion 50 and circulation path 120 are filled with liquid coolant.

Operation of the cooler will now be described herebelow.

The IC chip 24*b* of the CPU 24 generates heat during use of the portable computer 10. The heat generated by the IC chip 24*b* transfers to the heat receiving surface 83 of the pump through the second region 83*b*. The pump chamber 84 and the reservoir tank 86 of the pump housing 71 are filled with the liquid coolant, so that the liquid coolant absorbs much of the heat transferred to the heat receiving surface 83.

Energization of the stator 73*b* of the motor 73 may periodically occur such as in synchronous with the power-on of the portable computer 10. Thereby, a rotating torque occurs between the stator 73*b* and the magnet 73*c* of the rotor 73*a*, whereby the rotor 73*a* is rotated with the impeller 72. Upon rotation of the impeller 72, the liquid coolant in the pump chamber 84 is pressurized and drawn out from the discharge pipe 91, and concurrently, is led into the heat dissipation portion 50 through the first piping 121.

In the heat dissipation portion 50, the heat absorbed by the liquid coolant transfers to the dissipation fins 55, the first path component member 51, and the second path component member 52.

Upon rotation of the impeller 62 of the electric fan 60 during use of the portable computer 10, cooling air flows to the heat dissipation portion 50 from the outlet opening 61*a* of the fan casing 61. The cooling air passes through between the dissipation fins 55. Thereby, the dissipation fins 55, the first path component member 51, and the second path component member 52 are cooled. Then, much of the heat having transferred to the dissipation fins 55, the first path component member 51, and the second path component member 52 is transferred to and carried on the cooling air flow, being drawn out to the outer side of the first housing 21 through the exhaust openings 25.

The liquid coolant cooled in the course of flowing through the first to third path component members 51–53 of the heat dissipation portion 50 is guided into the suction pipe 90 of the pump housing 71 through the second piping 122. The liquid coolant is drawn into the reservoir tank 86 from the suction pipe 90. The liquid coolant thus returned in the reservoir tank 86 again absorbs heat from the IC chip 24*b*.

Referring now to FIGS. 2 and 7, the downstream end of the suction pipe 90 and the communication opening 87 are immersed in the liquid coolant stored in the reservoir tank 86. As such, the liquid coolant in the reservoir tank 86 flows into the pump chamber 84 from the communication opening 87.

The liquid coolant having been guided into the pump chamber 84 once again absorbs heat from the IC chip 24*b*, and is then transferred to the heat dissipation portion 50 through the discharge pipe 91. Consequently, heat from the IC chip 24*b* is serially transferred to the heat dissipation portion 50 through the circulating liquid coolant. Concurrently, the heat is dissipated to an outer side of the portable computer 10 from the heat dissipation portion 50.

In the portable computer 10 thus configured, the second region 83*b* of the heat receiving plate 78 of the pump 70 projects closer than the third region 83*c* toward the IC chip 24*b*. If, for example, the heat receiving surface 83 was flat or had a shape corresponding to the IC chip 24*b*, and a deviation occurred in the shape of the heat receiving surface 83, the heat receiving surface 83 may not thermally couple to the IC chip 24*b*. However, since the second region 83*b* projects closer than the third region 83*c* toward the IC chip 24*b*, the second region 83*b* is securely thermally coupled to the IC chip 24b. That is, the heat receiving plate 78 is securely thermally coupled to the IC chip 24b. Consequently, the pump 70 can securely absorb heat from the IC chip 24b so that the IC chip 24b can be efficiently and reliably cooled.

Similarly, the second region 83b of the heat receiving plate 78 projects closer to the IC chip 24b than other regions of the heat receiving plate 78, namely, the first region 83a and the third region 83c. Accordingly, the second region 83b is securely thermally coupled to the IC chip 24b. That is, the heat receiving plate 78 is securely thermally coupled to the IC chip 24b. Therefore, the IC chip 24b can be efficiently cooled.

In addition, the IC chip 24b is efficiently cooled by enlarging the thermal-coupling face between the second region 83b and the IC chip 24b. The urging force coupling the pump 70 to the IC chip 24b is adjusted to deflect the second region 83b to enlarge the thermal-coupling face between the second region 83b and the IC chip 24b.

In one embodiment of the invention, the heat receiving plate 78 grows thicker towards a center region having a convex shape to couple to IC chip 24b. In other words, the heat receiving surface 83 is smoothly curved. Thus, the urging force is not concentrated at any single point of the heat receiving plate 78 and may enhance the durability of the plate 78.

Furthermore, the heat receiving plate 78 in the pump 70 is the heat receiving portion. As such, the housing body 76 need not be formed out of a metal having a high thermal conductivity, but instead can be formed using a synthetic resin. Consequently, the cost of the pump 70 can be reduced.

Further, since the second region 83b has the projecting shape, when the pump 70 is mounted on the first housing 21, the heat receiving plate 78 is tangibly shaped to be thermally coupled to the IC chip 24b. Consequently, the IC chip 24b is efficiently cooled.

Further, the portable computer 10 has the mounting mechanism 100. With the mounting mechanism 100, the pump 70 is secured in a spring-loaded state such that the heat receiving plate 78 is securely thermally coupled to the IC chip 24b.

The embodiments of the invention are not limited to those illustrated in FIGS. 1–8. Another embodiment of the invention is shown in FIG. 9.

Figure 9:
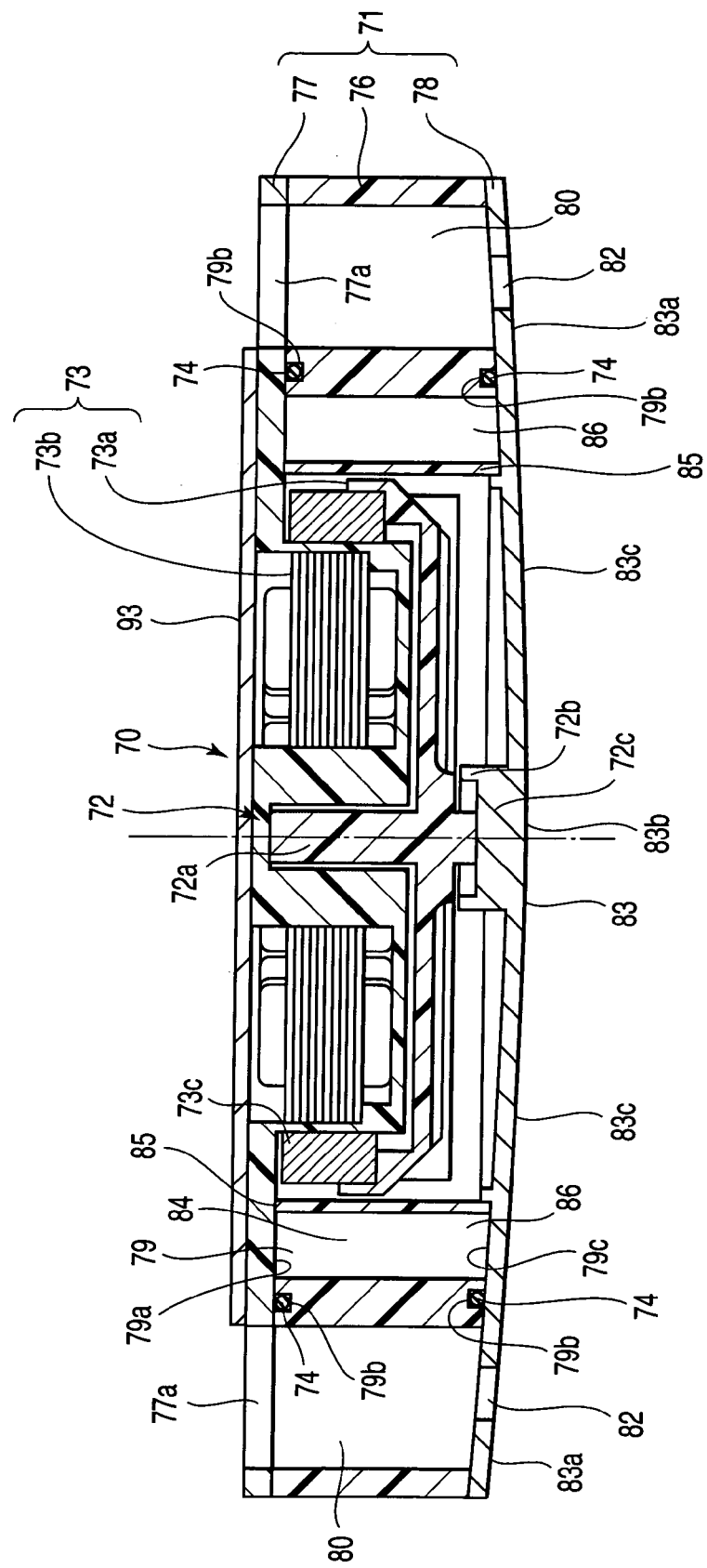
FIG. 9 is a vertical sectional view of a pump according to a second embodiment of the invention.

The embodiment of the invention shown in FIG. 9 is different from the above-described embodiments of the invention in the shape of the housing body 76 and the shape of the heat receiving plate 78. Other configuration portions of a portable computer 10 are the same as those embodiments of the invention previously described, so that the same reference characters as those of the first embodiment are used, and descriptions of the same portions are omitted herefrom.

With reference to FIG. 9, in the heat receiving plate 78, a boss portion 72c projecting to the interior of the accommodation portion 79 is formed corresponding to the rotation axis 72a of the impeller 72. The support portion 72b is formed in the boss portion 72c. The heat receiving plate 78, except the boss portion 72c, has a substantially constant thickness. The heat receiving plate 78 circularly bends, so that the second region 83b is formed to be convex shaped in the direction of the IC chip 24b, whereby the heat receiving plate 78 smoothly projects outward toward the IC chip 24b.

The lower end face of the housing body 76 is formed into a circularly projecting shape corresponding to the heat receiving plate 78. The lower end face is thus formed to make the lower opening 79c liquid-tight when the heat receiving plate 78 is mounted there-to.

According to the embodiment of the invention illustrated by FIG. 9, similar effects can be obtained to those of the embodiments of the invention illustrated in FIGS. 1–8. Further, the heat receiving plate 78, excepting the boss portion 72c has substantially a constant thickness, so that the material used to form the heat receiving plate 78 can be reduced, therefore enabling the cost of the pump 70 to be reduced. Further, the cost of the portable computer 10 can be reduced.

While the pump 70 has been described and illustrated in a number of embodiments, it is not to be so limited. For example, the pump 70 has been illustrated and described as having a heat receiving plate 78 as the structure being the heat receiving portion that is thermally coupled to the IC chip 24b. However, the housing body 76 may be integrally formed with a bottom shape having a bottom wall as the heat receiving portion by using a metal material, such as an aluminum alloy, with a high thermal conductivity. The bottom wall of the housing body 76 can be thus formed to project toward the IC chip 24b. A pump 70 having the housing body 76 thus formed is capable of efficiently cooling the CPU 24.

Additional modifications to embodiments of the invention will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pump comprising:
    a pump housing including
    a pump chamber, and
    a heat receiving portion to couple to a heat generating unit, the heat receiving portion has a first region to mount the pump to a printed circuit board and a second region to couple to the heat generating unit, the second region projecting outward further than the first region to couple to the heat generating unit;
    an impeller provided in the pump chamber; and
    a motor coupled to the impeller, the motor to rotate the impeller to pump a liquid coolant.

2. A pump according to claim 1, wherein the second region is circularly projected outwards into a convex shape to couple to the heat generating unit.

3. A pump according to claim 1, wherein the heat receiving portion of the pump housing comprises a heat receiving plate.

4. A pump according to claim 3, wherein the heat receiving plate has a variable thickness that increases in the second region to project further outward than the first region to couple to the heat generating unit.

5. A pump according to claim 3, wherein the heat receiving plate has a constant thickness and is convexly shaped to project further outward than the first region to couple to the heat generating unit.

6. A pump according to claim 1, wherein the heat generating unit is a central processing unit, the central processing unit including an integrated circuit coupled to a substrate.

7. A cooling system for an electronic device comprising:
    a heat dissipation portion to dissipate heat out from a coolant and away from a heat generating unit mounted in the electronic device;

a pump to transfer the coolant to the heat dissipation portion, the pump including
a pump housing having a pump chamber and a heat receiving portion to couple to the heat generating unit, the pump housing over the heat generating unit including a center region to couple to the heat generating unit to dissipate heat away from the heat generating unit into the coolant, the center region projecting outward further than other regions of the heat receiving portion to couple to the heat generating unit,
an impeller in the pump chamber, and
a motor coupled to the impeller, the motor to rotate the impeller in the pump chamber to pump the coolant;
a circulation path coupled between the pump and the heat dissipation portion, the circulation path to circulate the coolant between the pump and the heat dissipation portion to transfer the heat of the heat generating unit to the heat dissipation portion through the coolant; and
an electric fan located adjacent the heat dissipation portion, the electric fan to blow cooling air towards the heat dissipation portion.

8. A cooling system according to claim 7, wherein the center region is circularly projected outwards into a convex shape to couple to the heat generating unit.

9. A cooling system according to claim 7, wherein the heat receiving portion of the pump housing comprises a heat receiving plate, the heat receiving plate has a variable thickness that increases in the center region to project further outward than other regions to couple to the heat generating unit.

10. A cooling system according to claim 7, wherein the heat receiving portion of the pump housing comprises a heat receiving plate, the heat receiving plate has a constant thickness and is convexly shaped to project further outward than the other regions to couple to the heat generating unit.

11. An electronic device comprising:
a housing having a heat generating unit;
a heat dissipation portion in the housing to dissipate heat away from the heat generating unit;
a pump in the housing coupled to the heat generating unit, the pump to transfer a coolant to the heat dissipation portion, the pump including
a pump housing having a pump chamber and a heat receiving portion thermally coupled to the heat generating unit, the heat receiving portion including a first region to mount the pump over the heat generating unit and a second region coupled to the heat generating unit to dissipate heat away from the heat generating unit into the coolant, the second region shaped to project outward further than the first region of the heat receiving portion to couple to the heat generating unit,
an impeller in the pump chamber, and
a motor coupled to the impeller, the motor to rotate the impeller; and
a circulation path coupled between the pump and the heat dissipation portion, the circulation path to circulate the coolant between the pump and the heat dissipation portion to transfer heat away from the heat generating unit and into the heat dissipation portion.

12. An electronic device according to claim 11, wherein the heat generating unit is a central processing unit and the electronic device is a laptop computer.

13. An electronic device according to claim 11, wherein the heat receiving portion is convexly shaped to project outward from the pump to couple to the heat generating unit.

14. An electronic device according to claim 11, further comprising:
a securing means to mount the pump in the housing.

15. An electronic device according to claim 11, further comprising:
a printed circuit board in the housing; and
mounting means to mount the pump in the housing to the printed circuit board over the heat generating unit.

16. An electronic device according to claim 11, wherein the circulation path includes a first piping to receive hot coolant from the pump and to transfer the hot coolant to the heat dissipation portion,
the circulation path includes a second piping to receive cooler coolant from the heat dissipation portion and to transfer the cooler coolant to the pump.

17. An electronic device according to claim 11, wherein the pump housing further has a reservoir tank to fill with liquid coolant, and
the heat dissipation portion has dissipation fins to transfer heat out of the liquid coolant.

18. An electronic device according to claim 11, further comprising:
an electric fan in the housing, the electric fan to blow cooling air to the heat dissipation portion.

19. An electronic device according to claim 11, wherein the heat receiving portion of the pump housing comprises a heat receiving plate, the heat receiving plate has a variable thickness that increases in the second region to project further outward than the first region to couple to the heat generating unit.

20. An electronic device according to claim 11, wherein the heat receiving portion of the pump housing comprises a heat receiving plate, the heat receiving plate has a constant thickness and is convexly shaped to project the second region further outward than the first region to couple to the heat generating unit.

* * * * *